AGC SYSTEM FOR SIGNAL TRANSLATION SYSTEM UTILIZING SEMICONDUCTOR JUNCTION DEVICE IN FEEDBACK LOOP

Filed May 19, 1964 2 Sheets-Sheet 1

WITNESSES
Leon J. Taza
James F. Young

INVENTORS
Irving F. Barditch and
William Freeman
BY
John L. Viegraffe
ATTORNEY

United States Patent Office 3,365,673
Patented Jan. 23, 1968

3,365,673
AGC SYSTEM FOR SIGNAL TRANSLATION SYSTEM UTILIZING SEMICONDUCTOR JUNCTION DEVICE IN FEEDBACK LOOP

Irving F. Barditch, Baltimore, and William Freeman, Brooklyn Park, Md., assignors to Westinghouse Electric Corporation, East Pittsburgh, Pa., a corporation of Pennsylvania Filed May 19, 1964, Ser. No. 368,470
5 Claims. (Cl. 330—21)

ABSTRACT OF THE DISCLOSURE

An AGC system for a special frequency selective band-pass signal translation system is described. The signal translation system includes an active amplifier and a semiconductor p-n junction device constituting a distributed RC network with a regenerative feedback loop. The parameters and the characteristics of the RC network determines the operating frequency band of the system. One semiconductor region of the semiconductor device serves as the distributed resistance and its potential with respect to other components of the system and ground varies with the amplitude of the signal. The AGC system applies simultaneously a gain-controlling voltage to the amplifier and a compensating voltage to the other semiconductor region of the p-n junction device to prevent or minimize change in the band-pass characteristics of the system.

Figure 1:
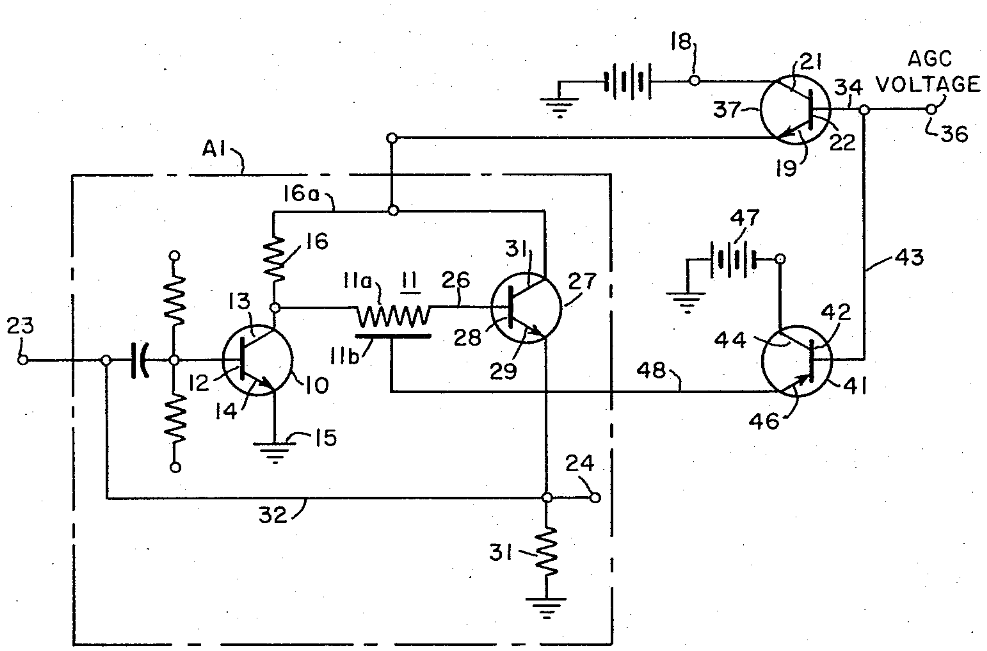

This invention relates to improvement in signal translation devices and more particularly to a band-pass system of the type not requiring inductances. The primary advantage of such a system is that it readily lends itself to miniaturization and molecularization.

This invention especially relates to a system in which the band-pass characteristic is accomplished by the use of distributed RC networks in association with transistors, both of which can be easily fabricated into monolithic semiconductor blocks. Such semiconductor devices are voltage sensitive and therefore maintaining a constant level of gain through such devices by the use of AGC systems raises problems, both as regards the gain and the center frequency of the band-pass.

Heretofore, in fabricating tuned amplifiers it is usually necessary to use tuning inductances, but as is well known in the art there are certain limits to the minimum size to which inductances may be reduced and, therefore, this seriously limits the upper signal frequency that can be handled by such devices. Also, aside from the physical considerations, miniaturization and molecularization of tuned amplifiers or signal translation systems is particularly desirable.

This necessitates a different approach to the fabrication of tuned, or band-pass, systems. Although it is common to refer to signals as having a single frequency, meaning inferentially a line spectrum, in practice signal energy is carried in a spectrum, or band, of frequencies. Therefore, the output signal is the resultant of a plurality of signal vectors. To avoid LC tuned circuits in facilitating monolithic block fabrication, in accordance with this invention and others owned by the assignee of this application, tuned or band-pass circuits are provided by operatively associating a plurality of parallel frequency sensitive paths between input and output terminals through which the signal energy is propagated wherein relative shifting of the phase of signals in the selected band is such that selected addition and cancellation takes place to provide the equivalent of tuned LC circuits. The present system utilizes RC networks and additional semiconductor devices, all of which are readily molecularized.

When used alone to provide band-pass frequency characteristics, ordinary passive resistance-capacitance networks do not ordinarily provide systems which are practical at certain frequencies due to the impedance levels in building the networks.

In other copending patent applications, hereinafter mentioned and owned by the assignee of this application, there is disclosed and claimed tuned signal translation systems using phase shifting RC networks associated with active devices having positive gain. These devices, unless carefully adjusted, have a tendency to become bilateral in nature. When such systems are cascaded this tendency increases. This places a limitation on the design of certain amplifiers, such as IF amplifiers used in radar and television sets, because of the staggered band-pass tuning that is required.

In copending applications Ser. No. 89,499, filed Feb. 15, 1961, in the names of Irving F. Barditch, Robert Bento and William Freeman, now Patent 3,204,192, dated Aug. 31, 1965; Ser. No. 80,877, filed Jan. 5, 1961, in the names of Irving F. Barditch and Edgar L. Fogle, now abandoned with the subject transferred to Ser. No. 455,241, filed May 12, 1965, in the names of Irving F. Barditch, John W. Dzimianski and Edgar L. Fogle; Ser. No. 122,457, filed July 7, 1961, in the names of Irving F. Barditch, Robert Bento, now Patent 3,244,995, dated Apr. 5, 1966; and Ser. No. 369,954, filed May 25, 1964, in the names of Irving F. Barditch, Robert Bento and Edgar L. Fogle, owned by the assignee of this application, there are described and claimed band-pass signal translation systems which utilize RC networks, which are passive, in association with positive gain devices to provide the band-pass characteristic. The present invention provides a combined isolation and AGC circuit configuration which can be used with such systems described in said copending applications in order to improve their operating characteristics and to avoid undesirable feedback and shifting of the center frequency of the band-pass while at the same time maintaining desired constant gain level. The present invention provides such an improved system in a very simple circuit configuration which can be fabricated completely within a monolithic block.

Accordingly, a primary object of the invention is to provide a novel and improved band-pass signal translation system.

Another object is to provide a novel and improved tuned signal translation system which can be completely miniaturized and molecularized in a single monolithic block.

Another object is to provide a novel and improved band-pass signal translation system having means for compensating against voltage changes necessary for automatic volume control in which all the components can be fabricated into a single monolithic block.

Figure 2:
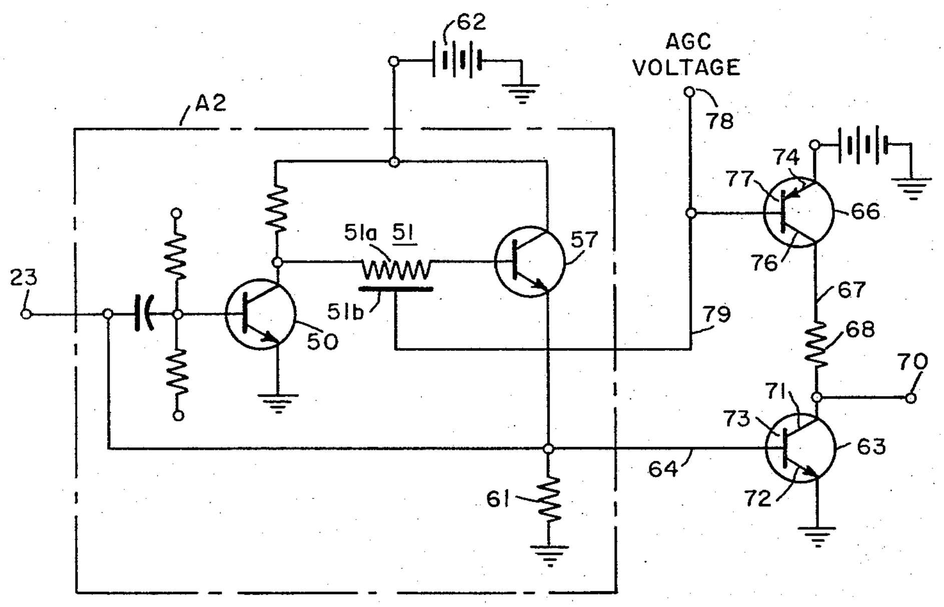
Figure 3:
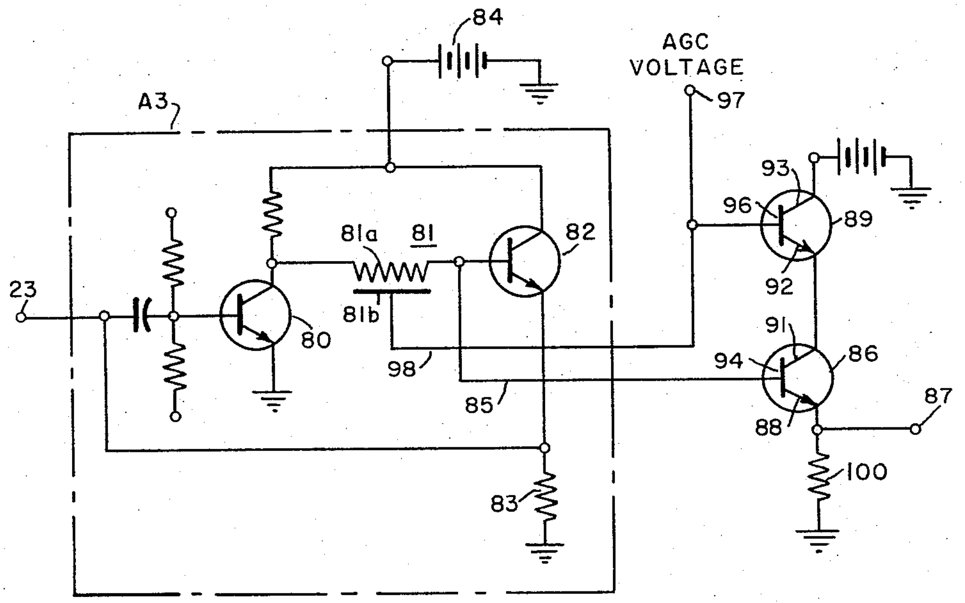
Figure 4:
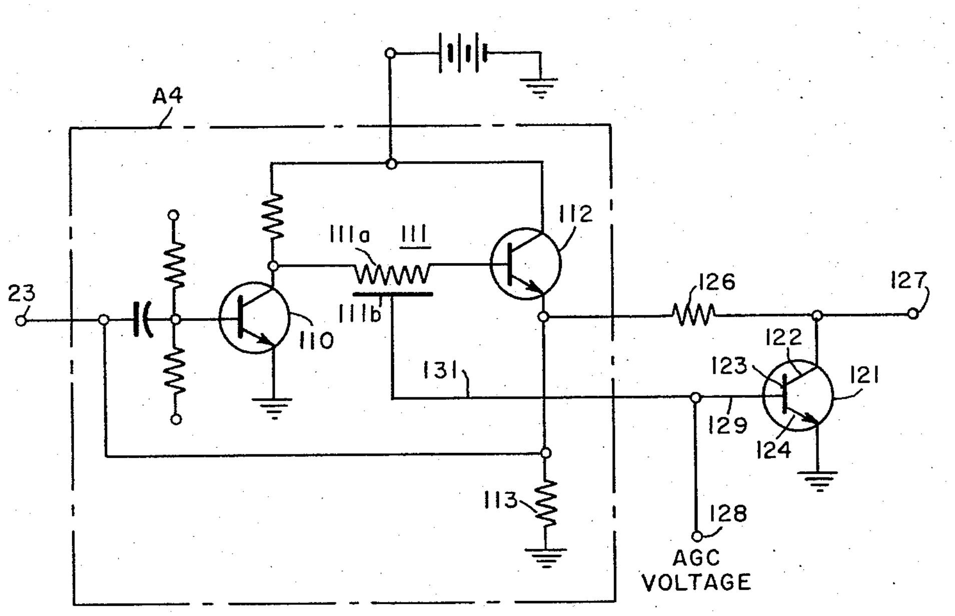

The invention itself, however, both as to its organization and method of operation as well as additional objects and advantages, will best be understood from the following description when read in connection with the accompanying drawing, in which:

FIGURE 1 is a circuit diagram of a signal translation system in accordance with the present invention; and FIGS. 2, 3, and 4 are circuit diagrams of modified forms of the invention.

Briefly speaking, the present invention provides an AGC system for a tuned signal translation system, which system gets its band-pass characteristic by reason of at least two parallel electrical paths in which at least one path has an active gain device, such as a transistor that provides a positive gain, preferably greater than unity, and provides a phase reversal for all signals coming through the device in combination with further passive phase shifting means to provide substantially a 360° phase shift of signals at selected frequency bands as they travel from the input to the output of the active path. The active device is voltage sensitive and its D.C. operative level varies with the amplitude of the input signals. The passive device, in the form of an RC network is voltage and frequency sensitive and since it is connected to the active device, variations of the input signal has a tendency to detune it. The present invention provides means for applying an AGC voltage to the passive device to prevent it from detuning while at the same time applying a correction voltage to a variable gain device at the output of the system to maintain a substantially constant output.

The other path is passive and serves as a coupling between the input and output for the purpose of reinforcing signals in the selected band of frequencies. In all of the embodiments illustrated, there is an output summing resistor at least a portion of which is between the junction of the paths and the common grounded output terminal. In the illustrated embodiments the value of the output impedance is so related to the input impedance that regenerative feedback is fed through the passive path to produce reinforcement of the selected band of signals at the input of the system. However, as far as the basic inventive concept of the present invention is concerned the second path could be adjusted relative to the output impedance in such a manner that the input impedance is less than that portion of the output impedance in the second circuit so that all signals are fed forward from the input through the system and reinforcement takes place at the output of the system as described and claimed in Patent 3,244,995.

In the first embodiment of the invention illustrated in FIG. 1, the portion within the dot-dash block A1, may be considered as the tuner portion in which two parallel paths are shown, the active path including a device, such as a transistor 10, having a gain greater than unity, in combination with a distributed RC filter network 11. The transistor 10 is connected as a grounded emitter and has a base 12 constituting the input to the system, a collector 13 and an emitter 14 which is grounded at 15. Since the transistor 10 is connected as a grounded emitter, all signals appearing at the collector output will be inverted, regardless of their frequency. In conventional manner the collector 13 is connected through a dropping resistor 16, conductor 16*a* and the emitter-base-collector circuit of a transistor 17 to a source of positive potential, not shown, but represented by the terminal 18. Conventional biasing means is also provided. The transistor 17 is of the PNP type wherein the emitter 19 and the collector 21 are made of positive semiconductor regions while the base 22 is made of N-type semiconductor material.

The distributed RC network 11 may be of the type described in Patent 3,244,995 or, alternatively, it could be of the type shown in Ser. No. 5,045, filed Jan. 27, 1960 in the name of William M. Kaufman, now Patent 3,212,032, issued Oct. 12, 1965 (also assigned to the assignee of this application), wherein the distributed resistance portion 11*a* is made of a suitably doped semi-conductor region of one conductivity and the other semi-conductor region 11*b* of opposite conductivity type, is one side of a distributed capacitance. By applying a suitable back-biasing voltage on this type of distributed RC network the capacitance can be changed readily and therefore the incremental parameters of the distributed RC are likewise changed which results in a shifting of a tuning of such a device. The shift in tuning is effected for the well known reason that signal level changes vary the D.C. operating points which shift the filter network bias point which in turn shifts the frequency.

The present system is a three terminal system with a common ground 15, the non-common input terminal being terminal 23 and the non-common output terminal being terminal 24. The first electrical path, in which the transistor 10 and the distributed RC network 11 is included, could be completed, if desired, through a conductor 26 connected directly to the output of the network 11 and the output terminal 24 as described in the aforementioned copending patent applications. However, in order to isolate the adverse effect of variations in the output impedance upon the system an isolating transistor 27 connected as an emitter follower has its base 28 connected to the conductor 26 and its emitter 29 connected through an output load resistor 31 to ground 15. The collector 31 of the transistor 27 is connected to the conductor 16*a* which carries the AGC controlled biasing voltage for both the transistors 10 and 27 in order to maintain constant gain in the output of the system between terminals 24 and ground. The second electrical path between the input terminal 23 and the output terminal 24 is through the conductor 32. The capacitor 25 gives D.C. isolation in the input circuit of the transistor 10.

The operation of the system so far described is similar to that described in copending application Patent 3,204,192, issued Aug. 31, 1965, owned by the assignee of this application, or similar to that of the operation of the forms of the system described in copending application Ser. No. 369,954, filed May 25, 1964, wherein the relative impedances of the input and output circuits are so adjusted that the input impedance is greater than the output impedance across the output load resistor 31 which causes regenerative feedback from the output to the input for the selected band of frequencies. Reviewing briefly the operation of the portion of the system so far described, all of the signal vectors of the input signals applied to the input terminal 23 will be supplied through the input coupling capacitor 25 to the base 12 of the first transistor 10. The first transistor 10 is connected as a grounded emitter so that the phase of all of the input signals will be inverted at the output of the collector 13 and in addition thereto there will be "an excess phase shift" of the signal vectors in a selected frequency band due to the equivalent distributed RC network of the base-collector junction of the transistor 10. The parameters of the distributed RC network 11 are such that for the normal bias voltage between the two semiconductor regions, 11*a* and 11*b*, there will be a further shift in the phase of the signal vectors in the selected band sufficient to give a 360° phase shift for that band of frequencies between the input terminal 23 and the output terminal 24. It will be recognized of course that there is a certain "excess phase shift" in the base-emitter junction of the transistor 27 and this of course is included in the overall phase shift between the input and output terminals. Feedback through the conductor 32 from the output terminal 24 to the input terminal 23 is regenerative for the selected frequency band so that reinforcement of signals in this selected band takes place at the input of the system.

Again, it is desired to emphasize that as far as the concept of the AGC control system of the present invention is concerned the conductor 32 could just as well be connected to a point on the output resistor 31 so that the input impedance across the input terminal 23 and ground would be less than the impedance across the point on the resistor 31 and ground, under which condition the operation would be characterized as "feed through" and a certain amount of the input signal would be fed directly to the lower portion of the output resistor 31 so that reinforcement of the signals in the selected frequency band would take place in the output circuit.

In the operation of the system of the present invention so far described, if an AGC voltage was applied to the conductor 16*a* the gain of the system would be varied by reason of the change of bias voltages simultaneously applied to transistors 10 and 27. An inspection of the circuit diagram will show that if a varying AGC voltage were applied to the base 22 of the transistor 37 through the conductor 34 and terminal 36 change in current through the output resistor 31 and through the collector resistor 16, the semiconductor region 11*a* would vary in potential with respect to the ground 15. This results in a change in the back-bias voltage across the junction of the semiconductor regions 11*a* and 11*b*, and it would be apparent from previous description and discussion that the parameters of the distributed RC network 11 would be altered, resulting in a shifting of the tuning of the network.

In accordance with the present invention means are provided for causing the potential variation on the semiconductor region 11*b* to follow, in direction and amount, the change in potential of the semiconductor region 11*a* so that variations of the control voltage to maintain the constant gain for the system also provides a compensating voltage to the semiconductor distributed RC network 11 to maintain its tuning at a constant point. To this end, a transistor 41, complementary to the transistor 37, has its base 42 connected through a suitable conductor 43 to the terminal 36 to which the AGC control voltage is applied. Both the collector 44 and the emitter 46 of transistor 41 are made of N-type semiconductor regions while the base 42 is made of a P-type semiconductor region. As previously mentioned, the transistor 41 is a complementary PNP type. The collector 44 is connected to the negative terminal of a suitable DC source of potential, such as a battery 47. The emitter 46 is connected through conductor 48 to the semiconductor region 11*b* of the RC network 11. It will be readily apparent that a change in the AGC control voltage applied to the terminal 36 will cause the potentials on the semiconductor regions 11*a* and 11*b* to change in the same direction and by substantially the same amount. Accordingly, the transistor 27, in cooperation with the transistors 37 and 41, serve to isolate the effects of changes in the output at terminal 24 from the input both as to volume level and tuning of the system.

In the modified form of the invention illustrated in FIGURE 2, the tuning section of the system comprising those components in the dotted line box A2, including a transistor 50, a distributed RC network 51, a transistor 57 and the output resistor 61, correspond to the components 10, 11, 27 and 31, respectively, of FIG. 1. In this modification, instead of the collectors of the transistors 50 and 57 being energized through an AGC amplifier transistor as in FIG. 1, these collectors are connected directly to a source of DC potential, such as the battery 62. In this embodiment a separate output isolation section comprising a grounded emitter transistor 63 is connected to the output of the transistor 57 by means of a conductor 64. However, as in the previous embodiment the transistor 63 is complementary to an AGC amplifier transistor 66 which regulates the biasing potential supplied through conductor 67 and collector resistor 68 to collector 71 of transistor 63. The output is at terminal 70. The collector 71 and the emitter 72 of the transistor 63 are of N-type semiconductor material while the base 73 of the same transistor is of P-type material. In the complementary transistor 66 the emitter 74 and the collector 76 are made of P-type semiconductor material while the base 77 is made of N-type semiconductor material. In this form of the invention the AGC control voltage is applied to the terminal 78, which is connected to the base 77 of transistor 66, and through the conductor 79 is connected to the capacitor semiconductor region 51*b* of the distributed RC network 51. As in the previous embodiment the distributed resistance portion 51*a* of the network 51 is connected between the collector of transistor 50 and the base of the transistor 57.

In the operation of this second embodiment the amplified AGC voltage controls the current through the resistor 68 which changes the bias on the transistor 63 to thereby control its gain. Although the base 73 of the transistor 63 varies up and down with respect to ground by a limited amount, in response to its output load, its effect on the tuning of the system is minimized by the cathode follower transistor 57. At the same time that the amplified control voltage controls the gain of the transistor 63 the AGC voltage changes the back-bias on the capacitor region 51*b* with respect to the distributed resistance region 51*a* of the network 51 in the proper direction and by correct amount so that substantially no detuning of the tuning section A2 takes place.

In the modified form shown in FIG. 3, the tuning section A3 is substantially identical with that of FIG. 2 and comprises a ground emitter input transistor 80, a distributor RC network 81, an output transistor 82 with an output emitter circuit resistor 83, the transistor 82 being connected as an emitter follower. As in the embodiment in FIG. 2 the transistors 80 and 82 are energized by a suitable source of DC potential such as the battery 84. The difference between this embodiment and that in FIG. 2 is that instead of the output of the system being taken from the emitter of the emitter follower transistor 82, the output may be taken either from the input or output of the distributor RC network 81. The output from the tuning section A3 is supplied over conductor 85 to the base of an emitter follower output transistor 86. In this latter embodiment, the output from the system is through the terminal 87 connected to the emitter 88 of the transistor 86. In this embodiment the gain of the emitter follower transistor 86 is controlled by an AGC amplifier transistor 89. The two transistors 86 and 89 are of the same type, such as NPN, and have their collector-emitter circuits connected in series. The AGC voltage is applied through terminal 97 to the base 96 of the AGC amplifier transistor 89 and through conductor 98 to the distributed capacitance semiconductor region 81*b* of the network 81. The AGC voltage applied to the base of the transistor 89 controls the bias on the emitter-follower transistor 86 and by reason of the change in current through the output resistor 100, the change in the bias current through the resistor 100 has the effect of changing the potential on the distributor resistance region 81*a* of the network 81. This change is in the same direction as the change in the voltage applied to the section 81*b* directly by the AGC voltage so that again the proper compensation is provided to permit variation in the gain of the system without causing detuning of the tuner section.

In the embodiment of the invention illustrated in FIG. 4, the tuning section A4 is substantially identical with that in FIG. 1, while the AGC detuning compensation configuration is different. As in the previous embodiments the tuning section includes a grounded-emitter input transistor 110, a distributed RC network 111 and an emitter-follower output transistor 112. As in the previous instances, the distributed RC network 111 may be made of the semiconductor type having two semiconductor regions of opposite type conductivity, the region 111*a* constituting a distributor resistance while the semiconductor 111*b* of the opposite conductivity constitutes the distributed capacitance section. As in the previous embodiments there is a suitable output resistor 113 in the emitter circuit of the transistor 112.

However, in this embodiment the gain or attenuation, at the output of the system is controlled by an AGC amplifier transistor 121, having the usual collector 122, base 123 and emitter 124 with the collector-base-emitter junctions included as a part of a resistive voltage divider, connected in parallel with the resistor 113, that also includes a resistor 126 connected to the emitter of the transistor 112. The output of this system is through the terminal 127.

A source of AGC voltage (not shown) may be supplied to the AGC voltage input terminal 128 which is connected through conductor 129 to the base 123 of transistor 121 and through conductor 131 to the semi-conductor capacitor region 111*b* of the RC network 111.

For an understanding of the operation of this embodiment, assume that input signals through input terminal 23 to the base of the transistor 110 decrease in amplitude and that the present system is operatively associated in a system wherein the AGC voltage decreases in magnitude with decreasing signal strength. As the signal level decreases the DC level at the collector of transistor 110 decreases, the DC voltage across the emitter follower resistor 113 will also decrease. This obviously moves the voltage at both ends of the distributed resistance region 111*a* toward ground. Since the AGC voltage then decreases to maintain constant gain of the system and thus through the conductor 131 carries the capacitor region 111*b* toward ground thus minimizing the change in potential difference between the sections 111*a* and 111*b* and thereby minimizing or eliminating any shift in the tuning frequency of the system. At the same time, the AGC voltage applied to the base 123 of transistor 121 causes a decrease in current through the voltage divider so that the output signal level at output terminal 127 is maintained at its constant level.

The significant feature of this latter embodiment is the same as that of the other embodiments, namely, that in a voltage-sensitive tuning system the tendency of the signal level change to detune the system is automatically compensated for by the usual AGC system that controls the gain. The above described embodiments are only a few of the specific embodiments that are capable of carrying out the objectives of the basic inventive concept. For example, it will be readily apparent to one skilled in the art that instead of the resistive voltage divider a combination resistive-capacitive voltage divider could be used where a back-biased semiconductor junction could serve as the variable capacitor. Also, one skilled in the art would understand that the emitter of the transistor 112 could be capacitively coupled to a voltage divider including resistive impedance in a series circuit with a source of potential and a transistor much like transistor 121 serving as the variable resistor in response to the AGC voltage.

Although the various embodiments described illustrate semiconductor type of distributed RC networks, it is to be understood that the invention is not so limited. It is applicable to systems where other types of voltage sensitive RC networks can be utilized in the fabrication of molecularized and/or miniaturized units, whether they have distributed or lumped parameters.

It will also be apparent to those skilled in the art that many other modifications can be made without departing from the spirit and intent of the present invention.

What is claimed is:

1. A band-pass signal translation system comprising input means and output means, circuit means including a first and a second transistor means and voltage-sensitive semiconductor distributed RC phase shifting means between said input and output means, said first transistor means being connected in a grounded emitter configuration and having its input connected to said input means, said second transistor means being connected in an emitter follower configuration and having its base-emitter junction included in a series circuit with said phase shifting means and the collector output of said first transistor means, said first transistor means providing a phase shift of all input signals by an amount due to the electrical phase relations between the input on its base and the output from its collector, means connected between the output of said second transistor means and the input of said first transistor means, said voltage-sensitive phase shifting means comprising a monolithic p-n junction having first and second regions of opposite respective conductivity types with one of said regions being connected in said series circuit and serving as a distributed resistance, means for applying an AGC voltage to said second transistor means and a complementary AGC voltage change to the other region of said p-n junction for compensating for the tendency of said phase shifting means to become detuned by signal level changes, said phase shifting means providing a phase shift of such value as to cause regenerative feedback from said output to said input for a selected band of frequencies.

2. The combination as set forth in claim 1, in which collector circuits of said first and second transistors and the other of said regions of said phase shifting means are energized, respectively, through complementary transistors, one of which is controlled by an AGC voltage.

3. The combination as set forth in claim 1, in which the AGC voltage is supplied directly to the other of said regions of said phase shifting means and to the base of a third transistor plus a fourth isolation transistor connected as a grounded emitter, with its base connected to the emitter of said second transistor, the collector of said fourth transistor being energized through the emitter-base-collector circuit of said third transistor.

4. The combination as set forth in claim 1, in which said AGC voltage is supplied directly to the other of said regions of said phase shifting means plus a third and a fourth transistor, a source of DC potential connected in a series circuit including the collector-base-emitter paths of both of said transistors in series, said AGC voltage also being connected directly to the base of said third transistor, said fourth transistor being connected in an emitter-follower configuration.

5. The combination as set forth in claim 1, in which a third transistor has its collector-base-emitter junctions included as a part of a resistive voltage divider between the emitter of said second transistor and ground, and the AGC voltage is connected directly to the other of said regions of said phase shifting means and to the base of said third transistor.

References Cited

UNITED STATES PATENTS

| | | | |
|---|---|---|---|
| 3,151,302 | 9/1964 | Hyman | 330—145 |
| 3,191,127 | 6/1965 | Theriault | 330—29 X |

OTHER REFERENCES

Barditch: "Adapting Conventional VHF Equipment to Molecular Electronics," Electronic Design, Feb. 17, 1964, pp. 44–51.

Lane: "A Synchronously Tuned 60 Mc. I.F. Amplifier With AGC," Application Data-Fairchild Semiconductor Corporation, App–26, 14 pages, received May 8, 1961.

ROY LAKE, *Primary Examiner.*

J. B. MULLINS, *Assistant Examiner.*